United States Patent
Lee et al.

(10) Patent No.: US 8,703,575 B2
(45) Date of Patent: Apr. 22, 2014

(54) METHOD OF FORMING ISOLATION AREA AND STRUCTURE THEREOF

(75) Inventors: Tzung-Han Lee, Taipei (TW); Chung-Lin Huang, Taoyuan County (TW); Ron Fu Chu, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 33 days.

(21) Appl. No.: 13/421,996

(22) Filed: Mar. 16, 2012

(65) Prior Publication Data

US 2013/0168801 A1 Jul. 4, 2013

(30) Foreign Application Priority Data

Jan. 2, 2012 (TW) .............................. 101100050 A

(51) Int. Cl.
*H01L 21/76* (2006.01)
*H01L 21/00* (2006.01)

(52) U.S. Cl.
USPC ..... 438/404; 438/400; 257/506; 257/E21.206

(58) Field of Classification Search
USPC ................................................. 438/142–218
See application file for complete search history.

(56) References Cited

U.S. PATENT DOCUMENTS

| 6,274,437 B1 * | 8/2001 | Evans ........................... 438/272 |
| 7,956,437 B2 * | 6/2011 | Williams et al. .............. 257/510 |
| 8,318,576 B2 * | 11/2012 | Shroff et al. .................. 438/386 |
| 2013/0093043 A1 * | 4/2013 | Kusaba et al. ................ 257/508 |

* cited by examiner

*Primary Examiner* — Seahvosh Nikmanesh
*Assistant Examiner* — Evren Seven
(74) *Attorney, Agent, or Firm* — Rosenberg, Klein & Lee

(57) ABSTRACT

The instant disclosure relates to a method of forming an isolation area. The method includes the steps of: providing a substrate having a first type of ion dopants, where the substrate has a plurality of trenches formed on the cell areas and the isolation area between the cell areas of the substrate, with the side walls of the trenches having an oxidation layer formed thereon and the trenches are filled with a metallic structure; removing the metallic structure from the trenches of the isolation area; implanting a second type of ions into the substrate under the trenches of the isolation area; and filling all the trenches with an insulating structure, where the trenches of the isolation area are filled up fully by the insulating structure to form a non-metallic isolation area.

2 Claims, 2 Drawing Sheets

METHOD OF FORMING ISOLATION AREA AND STRUCTURE THEREOF

BACKGROUND OF THE INSTANT DISCLOSURE

1. Field of the Instant Disclosure

The instant disclosure relates to a semiconductor device; in particular, to a method of forming an isolation area on the semiconductor and a structure thereof.

2. Description of Related Art

In recent years, along with the advance of technology in the field of the semiconductor integrated circuit manufacturing, the amount of components contained within each chip has increased significantly. However, the size of the chips has not grown consequently larger, in fact, smaller even with the rise of the component density in the chips. Furthermore, the width of the circuits has also advanced to grow smaller from micron to far smaller sizes. Nevertheless, regardless of how small a chip can be, all components within each chip have to be isolated or insulated appropriately before a fine quality can be achieved. Generally, the device isolation technology is adapted for isolation of the components. To provide further explanations, isolating barriers are formed between the components and the area/space occupied by the isolating barriers is minimized in every possibility under the condition of providing a good insulating effect. Thus, more chip areas can be provided for occupation of more components.

Among various device isolation technologies, the local oxidation of silicon (LOCOS) and the shallow trench isolation (STI) technologies are most adapted in the process of manufacturing. Particularly, the technology of STI has advantages such as a smaller area utilized for isolation, and the capability of maintaining a flat substrate after processing. Therefore, the STI technology has earned its popularity in the field of semiconductor manufacturing technology. However, with the development of the burying structure (such as burying the components within the chips), the word lines are then formed in the trenches. Therefore, the fine insulating effect provided by the STI technology will enable the word line trenches and the STI trenches to obtain different depths. Thus, at least two photo masks are required for manufacture of the aforementioned word line trenches and the STI trenches, and thereby increasing the complexity in production.

SUMMARY OF THE INSTANT DISCLOSURE

The object of the instant disclosure is to provide an improved method of forming an isolation area, where the isolation area formed is a non-metallic trench, and the isolation area can reduce the cell-to-cell leakage efficiently.

The improved method of forming an isolation area provided in the instant disclosure includes the following steps:
  providing a semiconductor substrate doped with a first type of ions, where the substrate has a plurality of trenches formed thereon, and the trenches are formed on cell areas and an isolation area between the cell areas; the side walls of each trench have an oxidation layer formed thereon, and the trenches are filled with a metallic structure;
  removing the metallic structure from the trenches of the isolation area;
  implanting a second type of ions into the semiconductor substrate under the trenches of the isolation area; and
  filling an insulating structure into the trenches, where the trenches of the isolation area are filled up fully with the insulating structure to form a non-metallic isolation area.

A structure of an isolation area is provided in the instant disclosure, includes: a semiconductor substrate having a first type of ion dopants and a plurality of trenches formed thereon, where the trenches are formed on cell areas and an isolation area between the cell areas of the substrate, and the side walls of each trench have an oxidation layer formed thereon. The trenches of the isolation area are filled up fully with an insulating structure to form a non-metallic isolation area, and the trenches of the cell areas are filled up fully with the insulating structure and a metallic structure. A second type of ions is implanted into the semiconductor substrate under the trenches of the isolation area.

The isolation areas of the instant disclosure utilize trenches which are filled with dielectric/insulating materials, cooperatively with the variation of ion doping concentration to produce an isolation structure, and thereby achieving an enhanced isolation effect. Furthermore, the cell-to-cell electricity leakage between the memory cells can be reduced to enhance the capabilities of the memory device.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
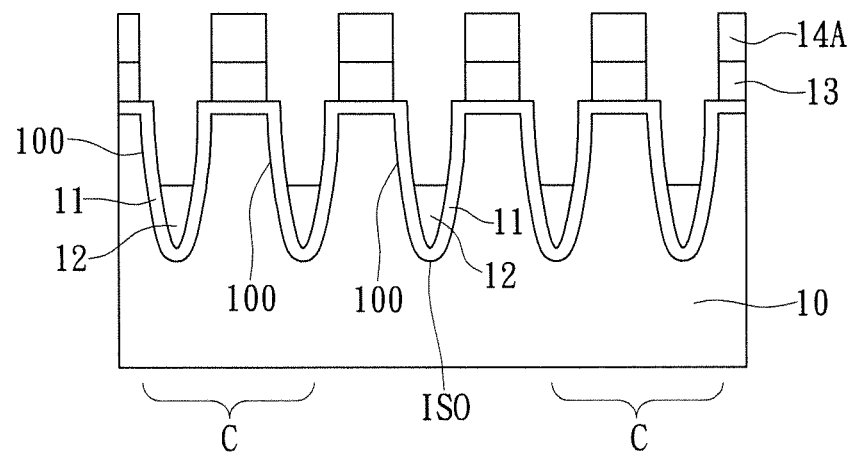
FIG. 1 shows a schematic view of a method of forming an isolation area according to a first step of the instant disclosure.

The instant disclosure describes a method of forming an isolation area. The method utilizes a non-metallic material to fill up the trenches to function cooperatively with ion implantation in achieving sufficient isolation between the cells on a substrate. Furthermore, all of the formed trenches on the substrate have the same depth, thus eliminating the need of using extra photo masks. In other words, the instant disclosure can simplify the process of the formation of the isolation area while reducing cell-to-cell leakage.

Please refer to FIGS. 1-4, which show the steps of forming the isolation area according to the instant disclosure:

Step 1: providing a substrate 10 doped with a first type of ions (e.g., n-type ions) and having a plurality of trenches 100 formed thereon. Specifically, the trenches 100 are formed on a plurality of cell areas C and an isolation area ISO between the cell areas C defined on the substrate 10. The side walls of the trenches 100 have an oxidation layer 11 form thereon, and the trenches 100 are filled with a metallic structure 12, such as titanium nitride (TiN). For the instant step, the substrate 10 has already undergone a semiconductor manufacturing process in pre-forming the trenches 100. The manufacturing process includes operations such as photolithography and etching. Accordingly, the locations of the trenches 100 define the cell areas C and the isolation area ISO. By the orientation of FIG. 1, the two trenches 100 on the left and the two trenches 100 on the right are located in the cell areas C, while the trench 100 located in the center is utilized in the formation of the isolation area ISO of the instant disclosure.

In addition, the instant disclosure does not require a deep trench in order to achieve the isolating effect. Hence, the conventional technique of using two photo masks can be simplified by using only one photo mask alone. In order words, all trenches 100 formed in the instant disclosure have the same depth (e.g., 800 um).

On the other hand, the oxidation layer 11, such as a gate oxidation layer, is formed on the side walls of the trenches 100 and on the surrounding ridges of the substrate 10. Whereas a plurality of polysilicon structures 13 and nitride structures 14 are formed on the oxidation layer 11 above the ridges of the substrate 10. As shown in the figure, the gate polysilicon layers (i.e., the polysilicon structure 13) are formed on the ridges of the substrate 10. Whereas the recessed access device (RAD) nitride layers (i.e., nitride structure 14A) are formed on the gate polysilicon layers.

Figure 2:
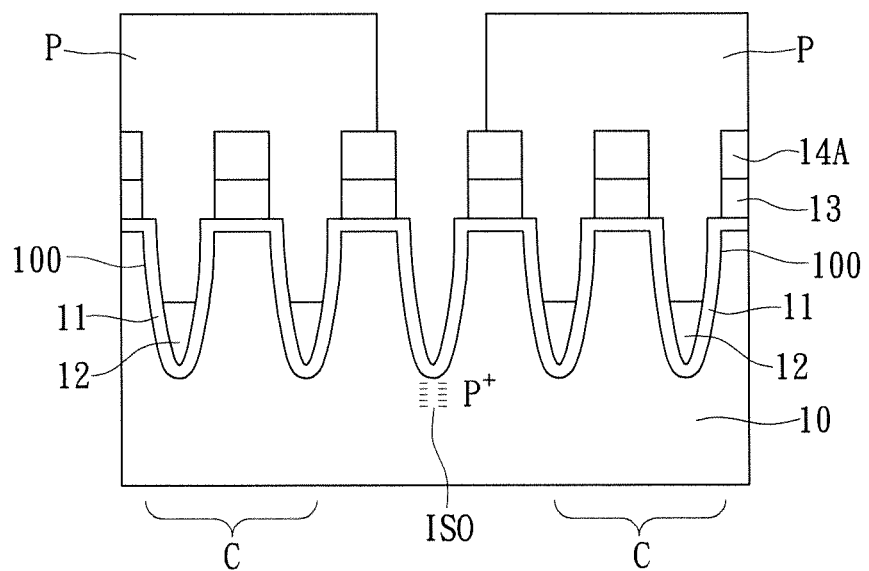
FIG. 2 shows a schematic view of the method of forming the isolation area according to a second and third step of the instant disclosure.
Figure 3:
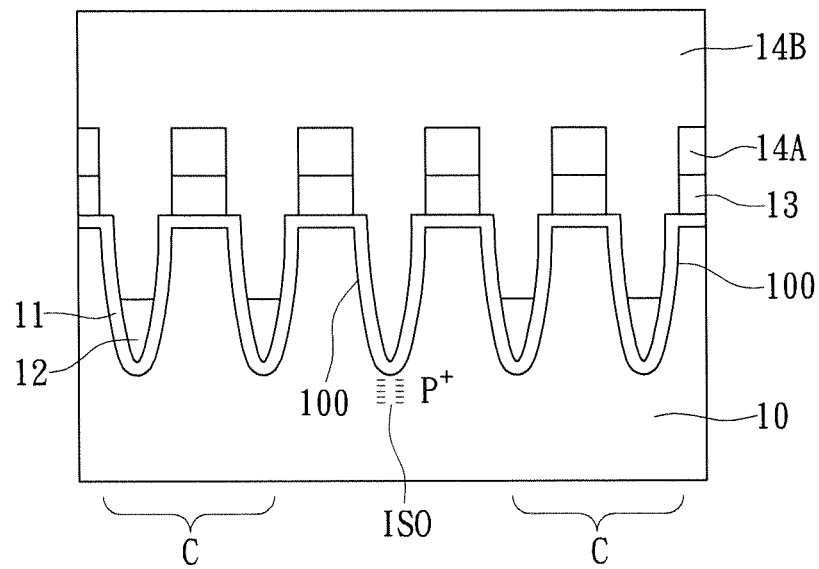
FIG. 3 shows a schematic view of the method of forming the isolation area according to a fourth step of the instant disclosure.

Step 2: removing the metallic structure 12 from the trenches 100 of the isolation area ISO. With reference to FIG. 2, in the instant step, the trenches 100 of the cell areas C are masked by photoresists P through means of photolithography to expose the trenches 100 of the isolation area ISO and its metallic structure 12. Next, the metallic structure 12 inside the trenches 100 of the isolation area ISO is removed by means of etching (e.g., wet etching). As shown in FIG. 2, only the oxidation layer 11 remains in the trenches 100 of the isolation area ISO.

Step 3: implanting a second type of ions into the substrate 10 under the trenches 100 of the isolation area ISO. Referring again to FIG. 2. For step 3, the second type of ions, such as boron and other p-type ions, are implanted into the substrate 10 by means of ion implantation. Due to the effect of the photoresists P, the p-type ions will be implanted under the trenches 100 (illustrated by the implantation area P+ shown in FIG. 2) of the isolation area ISO. The implanted ions can increase the degree of isolation between the cell areas C on both sides of the isolation area ISO. Thus, cell-to-cell leakage between the cell areas C can be reduced.

Step 4: filling all the trenches 100 with an insulating structure 14B, where the trenches 100 in the isolation area ISO is filled up fully with the insulating structure 14B to form a non-metallic isolation area ISO. Please refer to FIG. 3, which shows the isolation area ISO and the cell areas C covered entirely by the insulating structure 14B. In other words, the trenches 100 of the isolation area ISO and the cell areas C are filled up fully with the insulating structure 14B. The nitride structures 14A on the substrate 10 are also covered by the insulating structure 14B. For the instant embodiment, a PR-strip step is performed prior to Step 4 for removing the photoresists P. The insulating structure 14B is a nitride material, such as silicon nitride (SiN). Since silicon nitride has similar material properties with the nitride structures 14A, the nitride structures 14A and the insulating structures 14B can be removed concurrently in latter processes. Thus, the isolation area ISO doped with p-type ions underneath the trenches 100 and its insulating structure-filled trenches 100 form a non-metal gate isolation structure between the cell areas C. This non-metal gate isolation structure can effectively reduce cell-to-cell leakage between the cell areas C.

Figure 4:
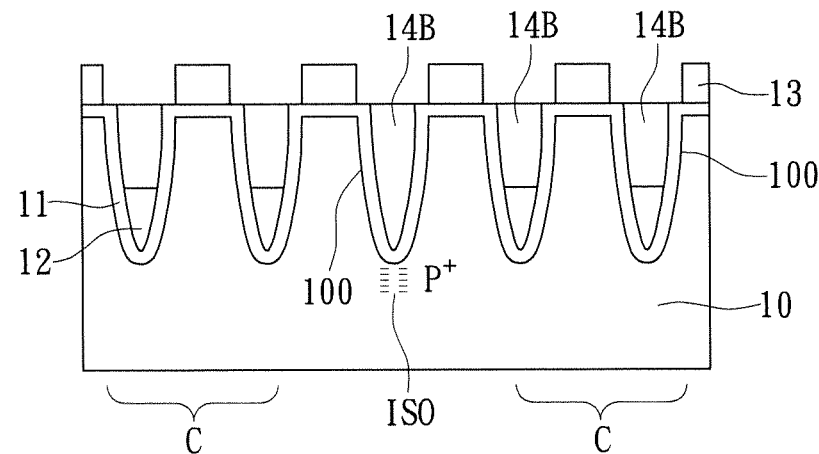
FIG. 4 shows a schematic view of an etching step in the method of forming the isolation area according to the instant disclosure.

In addition, after Step 4, an etching step can be further included to partially remove the nitride material, namely the nitride structure 14A and the insulating structure 14B. Thus, the polysilicon structures 13 are exposed as shown in FIG. 4. Based on the aforementioned steps, the substrate 10 have been implanted with the first type of ion dopants (e.g., n-type dopant), and the trenches 100 have been formed on the substrate 10. The formed trenches 100 are in the cell areas C and the isolation area ISO. The side walls of the trenches 100 have been coated with the oxidation layer 11, and the trenches 100 of the isolation area ISO have been filled up fully with the insulating structure 14B to form the non-metallic isolation area. The trenches 100 in the cell areas C have been filled with the insulating structure 14B and the metallic structure 12, and the second type of ions (e.g., p-type ion) have been implanted into the substrate 10 under the trenches 100 of the isolation area ISO.

Based on the above, the instant disclosure has the following advantages:

1. The trenches of the instant disclosure have the same depth. Therefore, a single photo mask alone is sufficient to accommodate the trenches in the isolation area and the cell areas, thus simplifying the manufacturing process.

2. The isolation area of the instant disclosure is filled with dielectric material (i.e., the insulating structure), which functions cooperatively with the ion dopants to prevent cell-to-cell leakage. Thus, the instant disclosure is capable of enhancing the capabilities of the memory device.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A structure of an isolation area, comprising:
   a substrate having a first type of ion dopants, the substrate having a first trench and a plurality of second trenches,
   wherein the substrate defines two cell areas and an isolation area between the cell areas, the first trench is formed in the isolation area, and the second trenches are respectively formed in the cell areas,
   wherein the first and second trenches have the same depth, and the side wall of each of the first and second trenches has an oxidation layer formed thereon,
   wherein the first trench is filled up fully with an insulating structure in forming a non-metallic isolation area, and each second trench is filled partially with a metallic structure and partially with an insulating structure,
   wherein a second type of ions is implanted into the substrate under the first trench to increase the level of electrical isolation between the cell areas.

2. The structure of an isolation area according to claim 1, wherein the substrate has a plurality of exposed polysilicon structures.

* * * * *